US010427965B2

(12) United States Patent
Eva (10) Patent No.: US 10,427,965 B2
(45) Date of Patent: Oct. 1, 2019

(54) METHOD FOR LOADING A BLANK COMPOSED OF FUSED SILICA WITH HYDROGEN, LENS ELEMENT AND PROJECTION LENS (71) Applicant: Carl Zeiss SMT GmbH, Oberkochen (DE)

(72) Inventor: Eric Eva, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 404 days.

(21) Appl. No.: 15/013,499

(22) Filed: Feb. 2, 2016

(65) Prior Publication Data
US 2016/0145137 A1    May 26, 2016

Related U.S. Application Data (63) Continuation of application No. PCT/EP2014/065950, filed on Jul. 24, 2014.

(30) Foreign Application Priority Data

Aug. 2, 2013 (DE) .......................... 10 2013 215 292

(51) Int. Cl.
*C03B 19/06* (2006.01)
*C03C 3/06* (2006.01)
(Continued)

(52) U.S. Cl.
CPC ............ *C03B 19/066* (2013.01); *C03B 19/09* (2013.01); *C03C 3/06* (2013.01); *G02B 1/02* (2013.01);
(Continued)

(58) Field of Classification Search
CPC ... C03B 19/066; C03B 19/09; C03B 2201/21; C03C 3/06; C03C 2201/21;
(Continued)

(56) References Cited

U.S. PATENT DOCUMENTS 2,272,342 A  *  2/1942  Hyde ...................... C03B 19/01
                                                        118/320
3,859,073 A  *  1/1975  Schultz ............. C03B 37/01433
                                                        428/428
(Continued)

FOREIGN PATENT DOCUMENTS

DE           19841932 A1     3/2000
DE      102007022881 A1    11/2007
(Continued)

OTHER PUBLICATIONS

R. H. Stolen, Ge. E. Walrafen. Water and its relation to broken bond defects in fused silica. The Journal of Chemical Physics, vol. 64, No. 6, Mar. 15, 1976.*

(Continued)

*Primary Examiner* — Collin X Beatty
(74) *Attorney, Agent, or Firm* — Edell, Shapiro & Finnan, LLC (57) ABSTRACT A method for loading a blank composed of fused silica with hydrogen, including loading the blank at a first temperature ($T_1$) and a first hydrogen partial pressure ($p_1$), and further loading the blank at a second temperature ($T_2$) which is different from the first temperature and at a second hydrogen partial pressure ($p_2$) which is different from the first hydrogen partial pressure. The first and second temperatures ($T_1$, $T_2$) are lower than a limit temperature ($T_L$) at which a thermal formation of silane in the fused silica of the blank commences. Also disclosed are a lens element produced from such a blank and a projection lens that includes at least one such lens element.

21 Claims, 2 Drawing Sheets (51) Int. Cl.
*G02B 1/02* (2006.01)
*G03F 7/20* (2006.01)
*C03B 19/09* (2006.01)
*G02B 13/14* (2006.01)
*G02B 13/16* (2006.01)

(52) U.S. Cl.
CPC ......... *G02B 13/143* (2013.01); *G02B 13/16* (2013.01); *G03F 7/70958* (2013.01); *C03B 2201/21* (2013.01); *C03C 2201/21* (2013.01); *C03C 2201/23* (2013.01); *C03C 2203/54* (2013.01)

(58) Field of Classification Search
CPC ... C03C 2201/23; C03C 2203/54; G02B 1/02; G02B 13/143; G02B 13/16; G03F 7/70958
USPC ......................................................... 359/355
See application file for complete search history.

(56) References Cited

U.S. PATENT DOCUMENTS

| | | | |
|---|---|---|---|
| 5,469,299 A * | 11/1995 | Nagano | G02B 13/143 359/355 |
| 6,205,818 B1 * | 3/2001 | Seward, III | C03C 21/007 204/157.41 |
| 6,810,687 B2 | 11/2004 | Nishimura et al. | |
| 7,064,093 B2 | 6/2006 | Kuehn et al. | |
| 7,082,790 B2 | 8/2006 | Kuehn et al. | |
| 7,265,070 B2 | 9/2007 | Boek et al. | |
| 7,501,367 B2 | 3/2009 | Kuehn et al. | |
| 7,534,733 B2 | 5/2009 | Bookbinder et al. | |
| 7,589,039 B2 | 9/2009 | Allan et al. | |
| 7,791,811 B2 | 9/2010 | Eva | |
| 7,928,026 B2 | 4/2011 | Bookbinder et al. | |
| 7,994,083 B2 | 8/2011 | Harper et al. | |
| 2003/0027705 A1 | 2/2003 | Nishimura et al. | |
| 2003/0115904 A1 | 6/2003 | Kuhn et al. | |
| 2005/0217318 A1 | 10/2005 | Kuhn et al. | |
| 2007/0004579 A1 * | 1/2007 | Bookbinder | C03C 3/06 501/54 |
| 2007/0266733 A1 | 11/2007 | Eva | |
| 2009/0056381 A1 | 3/2009 | Mueller et al. | |
| 2009/0252947 A1 | 10/2009 | Rosch | |
| 2011/0021339 A1 | 1/2011 | Schiefelbein et al. | |

FOREIGN PATENT DOCUMENTS

| | | | |
|---|---|---|---|
| DE | 102004017031 B4 | 10/2008 | |
| DE | 102009016599 A1 | 10/2009 | |
| EP | 1233005 A1 | 8/2002 | |
| EP | 1327612 A1 | 7/2003 | |
| JP | 2002316825 A | 10/2002 | |
| JP | 2008544947 A | 12/2008 | |
| JP | 2009057274 A | 3/2009 | |
| JP | 2009190958 A * | 8/2009 | ......... C03B 19/1453 |
| JP | 2009190958 A | 8/2009 | |
| JP | 2013500228 A | 1/2013 | |
| WO | 0229492 A1 | 4/2002 | |

OTHER PUBLICATIONS

Rei Kitamura, Laurent Pilon, and Miroslaw Jonas. Optical constants of silica glass from extreme ultraviolet to far infrared at near room temperature. Nov. 20, 2007 vol. 46, No. 33 Applied Optics.*
International Search Report in counterpart International Application No. PCT/EP2014/065950, dated Jan. 12, 2015.
Muehlig, C., 'Characterization of low losses in optical thin films . . . ', Institute of Photonic Technology, Germany, 2007.
Eva, E., 'Calorimetric determination of the UV radiation absorption . . . ', Laser-Laboratorium Goettingen, 1994.
Mann, K. et al., 'A novel photo-thermal setup for determination of absorptance losses . . . ', Laser-Laboratorium Goettingen, 2007.
English language translation of the International Preliminary Report on Patentability, and Written Opinion, in counterpart International Application No. PCT/EP2014/065950, dated Feb. 2, 2016.
Office Action in corresponding German Application No. 102013215292.2, dated Apr. 9, 2014, along with an English translation.
German Office Action with English Translation, Application No. 14 745 102.5, dated Feb. 26, 2019, 4 pages.
JP Office Action, Patent Application No. 2016-530444, dated Aug. 23, 2018, 5 pages.
English translation of JP Office Action, Patent Application No. 2016-530444, dated Aug. 23, 2018, 6 pages.

* cited by examiner

METHOD FOR LOADING A BLANK COMPOSED OF FUSED SILICA WITH HYDROGEN, LENS ELEMENT AND PROJECTION LENS

CROSS REFERENCE TO RELATED APPLICATIONS

This is a Continuation of International Application PCT/EP2014/065950, which has an international filing date of Jul. 24, 2014, and the disclosure of which is incorporated in its entirety into the present Continuation by reference. The following disclosure is also based on and claims the benefit of and priority under 35 U.S.C. § 119(a) to German Patent Application No. DE 10 2013 215 292.2, filed Aug. 2, 2013, which is also incorporated in its entirety into the present Continuation by reference.

FIELD AND BACKGROUND

The invention relates to a method for loading a blank composed of fused silica with hydrogen. The invention also relates to a lens element composed of fused silica and to a projection lens, in particular for immersion lithography, comprising at least one such lens element.

Optical elements, e.g. lens elements, composed of fused silica are used for example in projection exposure apparatuses for microlithography at wavelengths in the UV range. Such lens elements are typically produced by mechanical processing of a blank composed of a synthetic fused silica. The synthetic fused silica of the blank is produced by combustion of a silicon-containing, organic or inorganic precursor substance in $H_2$ and $O_2$, if appropriate with addition of a fuel gas such as natural gas, for instance. $SiO_2$ particles already form in the flame and are deposited on a target. In fused silica production, a distinction is made between the so-called direct process, in which a very hot flame is directed onto a hot target, such that the particles vitrify directly, and the so-called soot process, in which a porous body is deposited at lower temperatures and is sintered to form a solid glass body after drying and, if appropriate, doping.

Defects in the glass matrix of the fused silica, for instance missing bonds of the form O—Si. or O—Si—O, peroxy defects of the form Si—O—O—Si and ODC ("oxygen deficient centres") of the form O—Si—Si—O or simply just weakened matrix bonds ("strained bonds"), exist to different extents after the production of the fused silica depending on the process control. The first two defects mentioned can additionally arise under laser irradiation during later use as an optical element as a result of the breaking of weakened matrix bonds or peroxy or ODC defects. All of the defects mentioned are distinguished by strong absorption bands in the UV wavelength range, and some even connected with laser-induced density changes such as "compaction".

Absorption bands in the UV range are disadvantageous for the use of fused silica or of lens elements produced from fused silica in microlithography since radiation of a usually pulsed laser at an operating wavelength in the UV wavelength range is used there, to be precise typically radiation at a wavelength of approximately 193 nm (ArF laser). Hydrogen (or heavy hydrogen, i.e. deuterium) can saturate the first two defects mentioned to form O—Si—H or O—Si—OH (or to form O—Si-D or O—Si-DH), which have only weak absorption in the UV range.

In the case of directly deposited fused silica for use in the UV wavelength range, the flame stoichiometry is typically set such that there is a hydrogen excess and molecular hydrogen in the range of between approximately $5 \times 10^{16}$ and $10^{19}$ molecules/cm$^3$ is incorporated into the fused silica. At the same time, an OH content of between approximately 600 and 1300 ppm (by weight) is necessarily established in the fused silica material. Since the hydrogen is introduced hot during direct deposition, a high silane (SiH) content results. Such fused silicas are generally no longer used for lithography systems at an operating wavelength of approximately 193 nm, in particular for immersion lithography, since they exhibit strong polarization-induced birefringence and compaction (increase in density) during irradiation with higher energy densities and rarefaction (decrease in density) during irradiation with lower energy densities. With regard to the production of such a fused silica material, reference should be made for example to U.S. Pat. No. 7,265,070 B2, WO 02/29492 A1 and U.S. Pat. No. 7,064,093 B2.

Occasionally, instead of directly deposited fused silica, undried soot glass having an OH content of around approximately 250 ppm (by weight) or higher was used, which was sintered under inert gas (first generation) or hydrogen atmosphere (second generation) (cf. U.S. Pat. No. 7,082,790 B2 or DE 198 41 932 A1). Since the high OH content counteracts the formation of SiH, such comparatively dry glass could only be doped to significantly lower hydrogen contents than directly deposited fused silica.

In general, only soot glasses of the third generation are used nowadays for lithography systems operated at a wavelength of approximately 193 nm, which soot glasses are dried to OH contents of typically approximately 0.1 ppm to 100 ppm or 200 ppm, sintered, subjected to stress-relief annealing and only then loaded with hydrogen at "cold" temperatures of a maximum of 600°, but normally approximately 400° C. to 500° C. Such soot glasses exhibit compaction that is lower by a factor of 2-3 and FDT ("fluence dependent transmission"), polarization-induced birefringence and rarefaction that are lower by orders of magnitude in comparison with directly deposited glasses or soot glasses of the first or second generation; in this case, cf. for example: U.S. Pat. No. 7,501,367 B2, DE 10 2004 017 031 B4, U.S. Pat. Nos. 7,534,733 B2, 7,928,026 B2, 7,589,039 B2.

Cold loading, i.e. the loading of the fused silica blank with hydrogen at low temperatures, necessitates long loading times of a number of months for 5 to 10 cm thick blanks, depending on the required hydrogen content in the centre of the blank and the permissible hydrogen gradient in the volume of the blank. With a relatively long loading duration, more hydrogen diffuses into the centre of the blank, with the result that the gradient of the hydrogen spatial distribution in the blank decreases as the loading duration increases.

Although the diffusion time of the hydrogen into the fused silica material can be shortened somewhat by the use of an autoclave in which hydrogen is permitted to be kept at a pressure of more than 1 bar at the desired temperature, such an autoclave solves the problem of an excessively long loading duration only to a limited extent, since a hydrogen content in the edge regions of the blank of almost $1 \times 10^{18}$ molecules/cm$^3$ results even at a pressure of 2 bar, depending on the loading temperature used. If the required hydrogen content in the centre of the blank is an order of magnitude lower because hydrogen is no longer required there on account of the laser load and the loading time is intended to be kept as short as possible, this already results in a difference in refractive index at a wavelength of 193 nm of approximately 3 ppm between centre and edge of the (cylindrical) blank both along the cylinder axis and transversely with respect thereto. However, this difference in refractive index is of the same order of magnitude as, or is already greater than, the permissible refractive index inhomogeneity of a fused silica for lithography applications.

Two methods are known for nevertheless shortening the loading time: In a first method, which is described e.g. in U.S. Pat. No. 6,810,687 B2 and U.S. Pat. No. 7,994,083 B2, the partial pressure during loading is varied over time. The loading can start for example with a short loading at more than 100% hydrogen partial pressure relative to 1 bar ambient pressure, that is to say e.g. 100% hydrogen ($H_2$) relative to 10 bar ambient pressure, corresponding to 1000% partial pressure relative to standard conditions. As a result, a very high hydrogen content is forced into the outer regions of the blank composed of fused silica. Afterwards, this quantity of hydrogen is distributed further into the blank by storage under standard pressure. If storage does not take place under a hydrogen atmosphere, some hydrogen is again diffused into the outer regions of the blank which are free of hydrogen after annealing with 0% partial pressure.

What U.S. Pat. No. 6,810,687 B2 and U.S. Pat. No. 7,994,083 B2 have in common is that all loading and annealing and/or discharge is performed at constant temperature. The aim of said documents is essentially to shorten the residence duration in the expensive pressure loading furnace or else, in the three-part method, the residence duration in the pressureless hydrogen furnace. The achievable shortening of the total throughput time compared with loading at constant pressure is of the order of magnitude of approximately 20% depending on the geometry of the blank and stipulations concerning hydrogen contents and permissible gradients. Moreover, in these methods the maximum of the hydrogen content does not occur at the surfaces of the blank, but rather further inwards, where the high hydrogen content is generally not required. In this regard, an increased SiH content occurs locally in the glass volume and four slopes of the change in refractive index are traversed instead of two in the blank in the z-direction (in the direction of the optical axis), which results in increased image aberrations.

A further method for shortening the loading time, described in DE 10 2007 022 881 A1, provides for firstly processing the blank mechanically to a geometry close to the final geometry and then loading it with hydrogen. Since the loading time of the blank, for the same hydrogen content in the centre of the blank and the same permissible hydrogen gradients, increases with the square of the thickness of the blank, the loading time for a typical meniscus lens element, the local thickness of which at all points corresponds approximately to half the height of the circumscribing cylinder, can be shortened by a factor of 4. However, this method provides only slight advantages for all other lens element shapes (biconvex, biconcave, planoconcave, planoconvex), since here the local thickness is only insignificantly less than the thickness of the original cylindrical blank from which the corresponding lens element is produced.

US 2011/0021339 A1 describes a method for producing a component composed of fused silica which is intended to have a saturated induced absorption at wavelengths of less than 250 nm. In order to achieve this, Si—O defects in the fused silica are first removed by silane (SiH) being formed at said defects. In order to form the silane, the fused silica is loaded with molecular hydrogen at temperatures of more than 475° C. After the silane has been formed, the fused silica is loaded with additional molecular hydrogen at high concentrations starting from $5 \times 10^{16}$ molecules/$cm^3$ at temperatures of less than 475° C., in order to support a conversion of E' defect centres, which arise during the irradiation of the silane with laser radiation, into silane, i.e. the reaction equilibrium of SiH+photon<->Si.+H is intended to remain as much as possible on the left side.

SUMMARY

It is an object of the invention to optimize a method for loading a fused silica blank with hydrogen and in particular to shorten the loading duration, and to specify a lens element and a projection lens comprising at least one such lens element having improved optical properties.

This object is achieved with a method of the type mentioned in the introduction in which the loading with hydrogen comprises loading the blank at a first temperature and a first hydrogen partial pressure, and further loading the blank at a second temperature which is different from the first temperature and at a second hydrogen partial pressure which is different from the first hydrogen partial pressure, wherein the first temperature and the second temperatures are lower than a limit temperature at which a thermal formation of silane in the fused silica material of the blank commences.

For the purposes of this application, the term hydrogen or the designation H (or OH) is understood to mean all isotopes of hydrogen (protium, deuterium, tritium), unless indicated otherwise. Deuterium ($D_2$), in particular, besides protium ($H_2$), can likewise be used for the loading with hydrogen. The loading is typically carried out only with one of the hydrogen isotopes, i.e. either with $H_2$ or with $D_2$, but loading with mixtures of the two (or possibly with tritium $T_2$) is likewise possible. In the latter case, the hydrogen partial pressure relates to the sum of the $H_2$-partial pressure, the $D_2$ partial pressure and possibly the $T_2$ partial pressure. For the purposes of this application, the term silane is not understood to mean molecular silane (SiH), but rather Si—H bonds or Si—H groups which form in the $SiO_2$ glass matrix under specific conditions. As in US 2011/0021339 A1 cited in the introduction, in the present application, too, the silane content of the fused silica is understood to mean the number of Si—H bonds per volume element (typically: per $cm^3$).

With the exception of the method described in US 2011/0021339 A1, the loading methods used and described hitherto have only been methods in which a constant loading temperature is used for each blank, namely the maximum permissible (qualified) temperature for the respective application (glass type, lens type, lens element position, etc.). This maximum loading temperature is generally defined by the requirement for permitting only a small quantity of silane (SiH) and ODC. The silane content of a fused silica can be determined directly, e.g. by Raman spectroscopy, only with difficulty since the detection limit is too high in the case of Raman spectroscopy. However, the silane content directly influences the so-called "fluence dependent transmission", FDT, that is to say the setting of a dynamic absorption equilibrium as a function of the energy density, as is described for example in U.S. Pat. No. 7,928,026 B2. The FDT is specified there depending on the transient absorption K (in $cm^{-1}$) of the fused silica in the UV range and the fluence F, i.e. the energy density (in mJ/cm/pulse), specifically as the gradient dK/dF (in cm×pulse/mJ) of a linear approximation curve—determined by the least squares method—of the absorption K as a function of the energy density F.

In the case of an excessively high silane content (corresponding to an excessively high FDT gradient), the transmission of an optical arrangement in which an optical element composed of a corresponding fused silica material is used falls during the first seconds and minutes of operation (loss of efficiency) and, upon each use intermission or change in operating mode, a new equilibrium state will be established over the next minutes. During the operation of an optical arrangement in the form of a projection exposure apparatus, this makes it considerably more difficult e.g. to control the exposure dose on the photoresist (on the wafer). Furthermore, it is known that, in the case of an elevated SiH or ODC concentration, the lifetime properties such as e.g. compaction of the fused silica deteriorate as well.

The defect concentration (SiH or FDT gradient and ODC) established depends inter alia on the basic glass, to put it more precisely on the OH content thereof and on the type and concentration of the precursor defects. For a given basic glass (prior to loading) all the more defects are established after loading, the higher the loading temperature and the hydrogen concentration after loading. Theoretically, the loading duration (i.e. the spatially resolved concentration integral over the loading time) also has an influence, but it appears in practice to have only a small influence.

FIG. 2 of U.S. Pat. No. 7,928,026 B2 shows three ranges of the loading temperature for low OH glasses (<=100 ppm by weight): For temperatures significantly below 550° C. (first range) a resultant rise in the FDT gradient with temperature is extremely shallow (virtually at the measurement limit), in the range of 600° C.-700° C. (second range) a steep rise is manifested, and above 700° C. (third range) the rise is smaller again, but still distinctly resolvable metrologically. For fused silicas having a higher OH content (more than 550 ppm) only the first range is presented, since the second and third ranges shift to higher temperatures. The presented limits of the ranges for low OH fused silica do not apply generally, but rather are dependent on the defect density and the type of defects, as is evident from table 1 of U.S. Pat. No. 7,928,026 B2.

The maximum (qualified) loading temperature for a fused silica material having desired predefined properties (OH content, $H_2$ content after loading, etc.) is typically chosen such that it is below a limit temperature at which the FDT value rises significantly (i.e. the limit temperature lies before the transition from the first to the second range) and the thermal formation of silane thus increases significantly. In order to ensure a sufficient safety margin, the maximum permissible (qualified) loading temperature in the production process is typically chosen to be somewhat lower than the limit temperature.

US 2011/0021339 A1, which has a different objective (producing a glass having invariable absorption instead of glass having as little silane as possible) describes, by contrast, loading with hydrogen in two steps, wherein the first step is carried out at a temperature of more than 475° C., at which, in accordance with the teaching of US 2011/0021339 A1, a significant or complete conversion of stressed bonds into thermal silane takes place in the fused silica material.

The invention proposes a multi-stage loading method in which the temperature and the partial pressure during loading are chosen differently in at least two loading stage, wherein the temperatures in the two loading stages are chosen to be less than the limit temperature at which the thermal formation of silane in the fused silica material of the blank commences or at which the thermal formation of silane increases significantly. In this case, the partial pressures in the two loading stages are typically coordinated with one another in such a way that the desired hydrogen or deuterium content in the centre of the blank is established in conjunction with an economically tenable loading duration of the entire loading process (i.e. the sum of the time durations of the loading stages). Using a multi-stage loading method with variation of the temperature (and of the partial pressure), over large parts of the thickness of the blank it is possible to produce a comparatively low $H_2$ concentration, in association with a relatively low SiH concentration.

The loading duration of the first loading stage is chosen, in particular, such that only approximately 80-90% of the desired content of $H_2$ is established in the centre of the blank after the end of the first stage. Since the hydrogen diffuses further into the blank during the second loading stage, it is typically possible even in this case to achieve the desired content of hydrogen in the centre of the blank at the end of the second loading stage.

Preferably, the blank is loaded at a lower temperature in the second stage than in the first stage. The temperature in the second stage is chosen, in particular, to be (significantly) lower than the maximum permissible (constant) temperature during conventional loading. In this way, a high $H_2$ concentration can be produced in the outer regions of the blank given a suitable hydrogen partial pressure or given a comparatively short loading duration, wherein only a small increase in the SiH content of a maximum of a few 10% is established owing to the low temperature during loading despite the high $H_2$ content in the edge regions, i.e. the increase in the silane content is significantly smaller than in the case of conventional loading at a constant temperature. What can be achieved with the first stage carried out at a higher temperature is that the loading duration overall does not become too long and the loading thus does not become uneconomic.

In one advantageous variant, the blank is loaded at a higher hydrogen partial pressure in the second stage than in the first stage. The loading with a high hydrogen partial pressure makes it possible to produce a high $H_2$ content in the outer regions of the fused silica blank in conjunction with a comparatively short loading duration. As was explained further above, the partial pressures in the two loading stages are coordinated with one another such that a desired hydrogen distribution in the volume of the blank is produced in conjunction with the shortest possible total loading duration.

In a further variant, the limit temperature at which the thermal formation of silane in the fused silica of the blank commences or increases significantly is determined at a point preceding the loading. As was explained further above, the defect concentration or the number and distribution of the bond energies of the weakened bonds of the basic glass (i.e. of the fused silica prior to loading) depends on the method of producing the basic glass and on the material properties thereof, in particular on the OH content thereof. For determining the limit temperature, firstly a hydrogen content appropriate for the later application is defined for a basic glass (prior to loading), said hydrogen content being dependent on the maximum expected energy density and pulse number on the lens element which is intended to be produced from the blank. Samples or blanks are then produced, which are loaded with hydrogen at different temperatures until the predefined minimum hydrogen content (or a minimum distribution) is reached. The silane content of the loaded samples is subsequently determined in order to identify the limit temperature above which the silane content rises significantly. For the loading of a blank composed of a basic glass which has the same properties and has passed through the same production process as the samples, a temperature for the loading is defined which is less than the limit temperature or which is separated by a sufficient margin from the limit temperature.

In one development of this variant, the limit temperature is determined on the basis of a change dK/dF in the absorption coefficient K of the fused silica of the blank depending on the energy density F during the irradiation with pulsed laser radiation at a wavelength of 193 nm, as is described in U.S. Pat. No. 7,928,026 B2. This makes use of the fact that the silane content has a direct influence on the gradient dK/dF, such that a high value for the gradient dK/dF is an indicator of a high silane content. The limit temperature defined can be, for example, that temperature at which the gradient dK/dF is still below a threshold value, which can be for example approximately $5\times10^{-4}$ cm×pulse/mJ. Even smaller gradients dK/dF, e.g. $1\times10^{-4}$ cm×pulse/mJ, $5\times10^{-5}$ cm×pulse/mJ or $1\times10^{-5}$ cm×pulse/mJ, can be chosen as threshold values for determining the limit temperature.

In one variant, the blank is loaded at a temperature of less than 475° C., preferably of less than 450° C., in the first stage. The loading in the first stage is carried out, in particular, at the maximum (qualified) loading temperature for the respective type of glass (OH content, etc.), i.e. at a temperature which is only insignificantly less than the limit temperature (transition between first and second ranges in FIG. 2 in U.S. Pat. No. 7,928,026 B2). Particularly in the case of fused silica having a low OH content, a limit temperature of 475° C. typically should not be exceeded. Since the limit temperature increases as the OH content increases, however, in the case of fused silicas having a high OH content (>100 ppm), the first stage can, if appropriate, also be carried out at a comparatively high temperature (e.g. 600° C. or more). In this case, however, the fused silica material should be qualified with the FDT test described above, in order to ensure that the limit temperature is not exceeded. A high loading temperature in the first stage is also advantageous, if appropriate, if the fused silica or the lens element produced therefrom is subjected to only a comparatively low energy density, such that the hydrogen content in the centre of the blank can be set comparatively low. The lower the chosen hydrogen partial pressure in the first stage, the higher the loading temperature in the first stage can be chosen to be.

In a further variant, the blank is loaded at a temperature of less than 400° C., preferably of less than 300° C., in the second stage. The temperature in the second stage can be, in particular, less than 350° C., 300° C., 250° C., 200° C. or possibly lower. The conventional single-stage loading with hydrogen is generally not carried out at temperatures of less than approximately 400° C. since these temperatures can lead to loading times of the order of magnitude of approximately a year or more in the case of comparatively thick blanks. In the case of the two-stage loading described here, by choosing a comparatively high partial pressure in the second stage even at a comparatively low temperature it is possible to introduce a high $H_2$ content into the outer regions of the blank.

In one variant, the blank is loaded at a hydrogen partial pressure of 20% or less, preferably of 10% or less, in the first stage. The partial pressure at which the blank is loaded with hydrogen influences (in the same way as the loading duration) the distribution of the hydrogen over the volume of the blank. A comparatively low partial pressure of approximately 20% or approximately 10% leads, even in the case of a loading duration that is not too long, to a comparatively homogeneous hydrogen distribution in the blank, i.e. to a distribution for which the hydrogen content in the outer regions of the blank is only slightly greater than that in the centre of the blank. The hydrogen partial pressure (in %) indicated above is relative to standard conditions or to standard pressure, i.e. to 1 bar. A hydrogen partial pressure of more than 100%, e.g. 1000%, is therefore possible; the latter corresponds to a hydrogen content of 100% at 10 bar in the loading atmosphere of the furnace.

In a further variant, the blank is loaded at a hydrogen partial pressure of more than 50%, preferably of more than 90%, particularly preferably of more than 100%, in the second stage. The loading at a high hydrogen partial pressure has the effect that for the same loading duration the difference between the hydrogen content in the outer regions of the blank with respect to the centre of the blank turns out to be larger than at a lower partial pressure. With the use of an autoclave in which the loading with hydrogen can be carried out at a pressure of more than 1 bar, it is also possible, if appropriate, to perform the second stage at a hydrogen partial pressure of more than 100%, for example of 200% (i.e. 100% at 2 bar).

The loading described above is typically performed on a fused silica blank which was produced in a soot process. Such a blank typically has a low OH content that can be for example less than 200 ppm by weight, less than 100 ppm by weight, less than 50 ppm by weight, less than 20 ppm by weight, less than 10 ppm by weight, less than 5 ppm by weight or less than 1 ppm by weight.

The hydrogen partial pressure can be varied, if appropriate, within a loading stage (at a constant temperature), as is described for example in U.S. Pat. No. 6,810,687 B2 and U.S. Pat. No. 7,994,083 B2 cited in the introduction. Moreover, it is possible, if appropriate, for the blank already to be mechanically processed prior to loading and, in this way, for a geometry to be produced which is adapted to the geometry of the lens element to be produced from the blank, as is described in DE 10 2007 022 881 A1. As was explained further above, the loading time can be significantly reduced in this way particularly in the case of a lens element in the form of a meniscus lens element.

Between the first and second loading stages, the temperature is permitted to fall to room temperature since, in general, no relevant diffusion of hydrogen within the volume of the blank takes place any longer at room temperature. It is therefore not necessary for the second loading stage to directly follow the first loading stage, and so the blanks can be stored between the first and second stages. In this way a plurality of blanks can be collected in order to be subjected to the second loading stage in a furnace in a common batch.

A further aspect of the invention relates to a lens element composed of fused silica, at which a surface and a further surface for passage of radiation are formed wherein the lens element has as far as a distance of 1 mm from the surface a content of hydrogen of at least $5\times10^{16}$ molecules/cm$^3$, preferably of at least $5\times10^{17}$ molecules/cm$^3$, in particular of at least $10\times10^{17}$ molecules/cm$^3$, wherein the content of hydrogen falls—in particular monotonically—in the volume of the lens element to a minimum value of 10% or less of the content of hydrogen at the surface. The surface can be, in particular, a substantially planar light exit surface of a last lens element of a projection lens for immersion lithography.

It has proved to be advantageous if the hydrogen content as far as a distance of 8 mm from the surface falls to 50% or less of the hydrogen content at the surface.

Preferably, the silane content varies over the thickness of the lens element by not more than 50%, particularly preferably by not more than 30%, in particular by not more than 20%. Since practically no more silane is formed in the second stage, the variation of the silane content depends only on the magnitude of the resulting ratio of maximum and minimum silane content after the first loading stage. Said ratio can be set by the duration of the first loading stage, wherein longer loading durations in the first stage lead to a smaller variation of the silane content. The lower the chosen hydrogen partial pressure in the first stage, the higher the loading temperature in the first stage can be chosen to be.

The lens elements in an optical system, for example a scanner for semiconductor lithography, are often situated either in a convergent beam or in a divergent beam. A light beam which emanates from a point on the mask and is imaged onto the wafer (but if appropriate also for lens elements in the illumination system, even if no imaging takes place there) is considered for explanation purposes. As a result of the arrangement in the convergent or divergent beam path, the diameter of the light beam is typically smaller on one of the two lens element surfaces than on the other. The highest energy densities on the lens elements are generally attained with dipole or quadrupole illumination settings, in which two or four small light beams radiate through each lens element in the edge region thereof.

Since the energy density in the lens element increases with the square of the diameter of the (possibly elliptically shaped) light beam passing through the lens element, a factor of two in the energy density arises in the case of a difference between the diameters of the light beam on the two lens element surfaces impinged on by radiation of approximately 1.41. Since the hydrogen requirement in the case of most fused silica materials increases with the square of the energy density in the respective volume through which radiation passes, in the case of such a difference between the diameters of the light beams at the surfaces of the lens element the resultant hydrogen requirement in the centre of the lens element is lower by approximately a factor of 4 than the hydrogen requirement at that surface of the lens element having the smaller beam diameter. If said surface is a concave surface, a planar surface or an only slightly convex surface, the location of the highest energy density will be situated in the vicinity of the side surface (typically at the transition from the side surface to the end side) of the original blank, i.e. at the location of the maximum hydrogen content. For highly convex lens element surfaces, mechanical preprocessing of the blank prior to loading is advantageous, as is described in DE 10 2007 022 881 A1 since after preprocessing the convexly curved lens element surface substantially corresponds to the edge of the preprocessed blank.

The last lens element of an immersion system for microlithography is typically a planoconvex lens element, i.e. the latter has a generally planar exit surface. The large numerical aperture (NA>1.3) results in a difference between the energy density in the central plane of the blank from which the lens element is produced and the region of the exit surface of more than 1:5 and hence a difference in the $H_2$ requirement of typically more than approximately 1:25. Therefore, it is advantageous to provide such a lens element with a distribution of the hydrogen content which, proceeding from the (planar) exit surface, at which a high hydrogen content is required on account of the high energy densities of approximately 0.5 mJ/cm$^2$/pulse that occur there, reduces the hydrogen content as far as the centre of the lens element significantly (by at least a factor of 10, if appropriate a factor of 15, 20 or more). By virtue of the two-stage loading process described above, the change in the silane content in comparison with the change in the hydrogen content over the volume of the blank turns out to be smaller than in the case of single-stage loading, that is to say that the silane content, which is typically likewise at a maximum in the region of the surface on account of the maximum hydrogen content present there, decreases in the volume of the lens element, to put it more precisely in the thickness direction of the lens element, ideally to not less than 50% or 70% or 80% of the maximum value.

In one embodiment, the hydrogen content as far as a distance of 8 mm from the surface falls to 40% or less, preferably 30% or less, of the hydrogen content at the surface. As was explained further above, a high hydrogen content is typically necessary only in a volume region of the lens element which directly adjoins the surface, such that the hydrogen content at a distance of 8 mm from the surface can already be significantly reduced.

In a further embodiment, the hydrogen content as far as a distance of 25 mm from the surface falls to 10% or less of the hydrogen content at the surface. In the case of a terminating lens element of a projection lens for microlithography, the distance of 25 mm corresponds approximately to the region of the central plane of the blank from which the lens element was produced. In general, a comparatively low (minimum) hydrogen content is required in this region since the energy density is comparatively low there.

In a further embodiment, the content of hydrogen rises in the thickness direction of the lens element from the minimum value as far as a further surface of the lens element for passage of radiation to not more than 30% of the content of hydrogen at the first-mentioned surface. In the case of a lens element arranged in the convergent or divergent beam path, different beam diameters typically occur at the two surfaces impinged on by radiation, wherein, as was described above, a particularly high hydrogen content is required only at that surface at which the higher energy density occurs, that is to say that a hydrogen distribution that is substantially mirror-symmetrical in the thickness direction of the lens element is not required.

In order to produce a hydrogen distribution that is asymmetrical over the thickness of the lens element, the lens element can be produced with an oversize, for example, and a corresponding piece of the blank in which a high hydrogen content is present can be separated after the loading with hydrogen. Moreover, it is possible, if appropriate, to produce a blank having a doubled thickness and to produce two lens elements from said blank, of which lens elements a lens element surface subjected to a high energy density respectively faces an end side of the blank, as is described e.g. in U.S. Pat. No. 7,791,811 B2. In this case however, the loading duration of the first loading stage is quadrupled on account of the doubled thickness of the blank.

A further aspect of the invention relates to a lens element composed of fused silica, at which a surface and a further surface for passage of radiation are formed, wherein at least at a location in the volume of the lens element the content of hydrogen has a minimum value of less than $2 \times 10^{15}$ molecules/cm$^3$, wherein the content of hydrogen at the surfaces is 1.5 times to 5 times the minimum value, and wherein the silane content at the surfaces of the lens element is between 1.1 times and 2.20 times the silane content at the location in the volume of the lens element having the minimum value of the hydrogen content.

The properties described above can theoretically be realized for all types of lens elements, but are advantageous particularly in the case of lens elements having a low radiation load and/or having small differences in energy density on the front side and the rear side. If the energy density is low, purely computationally a hydrogen content of $1 \times 10^{15}$ molecules/cm$^3$ or less in the centre of the lens element, to put it more precisely in the centre of the typically cylindrical blank from which the lens element is produced, might be sufficient. From practical considerations, however, a higher minimum content of approximately $5\text{-}10\times10^{15}$ molecules/cm$^3$ is chosen in the prior art, specifically for the following reasons:

At temperatures of 300° C.-500° C. and diffusion lengths of a number of centimeters during loading, even small temperature fluctuations (e.g. control tolerance or local fluctuations in the furnace) have a great influence on the actual hydrogen content in the centre of the blank. When defining the hydrogen content in the centre of the blank, therefore, it is possible to choose a content which is of a magnitude such that it can be detected, and if appropriate corrected, e.g. by Raman spectroscopy (detection limit approximately $5\times10^{15}$ molecule/cm$^3$ with a tenable outlay). Moreover, overloading with hydrogen in the centre of the blank can be deliberately performed in order to have a safety factor for the temperature fluctuations, such that even in the event of temperature fluctuations the required minimum content in the centre of the blank is reliably achieved without verification measurement.

A further reason for choosing a comparatively high hydrogen content in the centre of the blank is that there are defects (e.g. ODCs, greatly weakened bonds) and impurities (e.g. oxygen during sintering in oxygen-containing gas) which react with hydrogen virtually instantaneously on the timescale of loading processes (weeks or months). This results in a decrease in the effective diffusion constant because in each volume element of the blank a hydrogen content appreciably different from zero can occur only when all rapidly saturable defects are actually saturated. For this reason, too, it is advantageous to measure the hydrogen content in the centre of the blank or to perform overloading with hydrogen.

The dependence of the formation of SiH as a function of the hydrogen concentration primarily concerns stretched bonds, the bond energy of which is a distribution function. Such stabler stretched bonds will react to form silane only if enough free hydrogen and a sufficient activation energy are present, i.e. the reaction proceeds more slowly than in the case of the above-described instantaneous saturation of highly reactive defects.

In the case of the exemplary embodiment described here of a lens element in which the expected energy density at the surfaces is not too high, it is proposed to determine the density of reactive defects and contaminants in the blank theoretically or experimentally and to define a mean content of hydrogen in the blank which is composed of the maximum defect density, the hydrogen requirement calculated from the energy density in the centre of the blank and a safety factor and which is typically of the order of magnitude of approximately 0.2 to $2\times10^{15}$ molecules/cm$^3$ and which is thus lower than in the case of conventional single-stage loading.

During the loading of the lens element or of the blank with hydrogen, in the first stage a partial pressure is chosen which leads to a content at the edge of the blank, i.e. in the region of the surfaces to be impinged on by radiation, of approximately 1.5-5 times more than in the centre of the blank, that is to say that the hydrogen content at the surfaces or in a volume region directly adjacent to the surfaces after the first stage can be for example between approximately $0.3\times10^{15}$ molecules/cm$^3$ and $1.0\times10^{16}$ molecules/cm$^3$. In this case, the hydrogen content rises typically monotonically from the location having the minimum hydrogen content to the surface of the lens element.

In the case described here, it is advantageous if the loading with hydrogen in the first stage is carried out at a markedly high temperature of 700° C. to 1000° C., wherein it must be ensured that a fused silica material is used with which the limit temperature at which the thermal formation of silane commences is not exceeded, i.e. typically a fused silica material having a high OH content of e.g. 500 ppm or higher. At these high temperatures, temperatures deviating by e.g. 25° C. are scarcely of any significance, and so the effect of temperature fluctuations during loading is extremely small. As a result, in particular, the target content in the centre of the blank after the first stage can be calculated only from the defect density and a safety allowance. The second loading stage can correspond to the previously known single-stage loading process at temperatures of between e.g. 400° C. and 500° C., wherein it is possible to dispense with the overloading of the blank in the centre on account of an unknown defect density, which results in a significant shortening of the duration of the loading process.

Since the hydrogen diffusing into the fused silica material still reacts locally with defects, high concentrations of free hydrogen do not occur either, and so hardly any SiH can form from "normal" stretched bonds in the first loading stage. In the second stage, the hydrogen required in the edge regions is introduced at a lower temperature, as a result of which only a low content of silane is formed in the second stage, too. Overall, therefore, in this case, too, this results in a comparatively small change in the silane distribution over the blank (in the thickness direction of the lens element), that is to say that the ratio between the maximum silane content, which is typically assumed at the edge of the blank, and the minimum silane content (generally in the axial centre of the blank) in the volume of the blank (and thus also in the volume of the lens element produced therefrom) is less than the square root of the ratio between the maximum hydrogen content and the minimum hydrogen content in the volume of the lens element or of the blank. Given a ratio of 10:1 between maximum hydrogen content and minimum hydrogen content, the ratio of maximum and minimum silane content is e.g. less than 3:1, that is to say that the silane content decreases in the volume of the lens element typically by less than approximately ⅓, i.e. by less than approximately 33%.

A further aspect of the invention relates to a lens element composed of fused silica, wherein the ratio between the maximum silane content and the minimum silane content in the volume of the lens element is lower than the square root of the ratio between the maximum hydrogen content and the minimum hydrogen content in the volume of the lens element. Such a lens element can have, in particular, the properties that were specified in association with the lens elements described further above.

As was explained further above, the ratio between the maximum and minimum silane content in the volume of the lens element substantially corresponds to the ratio of maximum to minimum silane content after the first loading stage (at a constant temperature). Said ratio corresponds approximately to the square root of the ratio between the maximum hydrogen content and the minimum hydrogen content in the volume of the lens element after the first loading stage. In the second loading stage, further hydrogen is introduced into the edge regions of the lens element, as a result of which the ratio of maximum hydrogen content to minimum hydrogen content increases after the second loading stage. However, practically no additional silane is formed any longer in the second loading stage, such that the ratio of maximum to minimum silane content after the second loading stage is less than the square root of the ratio between the maximum hydrogen content and the minimum hydrogen content after the second loading stage. In particular, the ratio between maximum and minimum silane content in the lens element can be more than 10%, 20%, 30%, 40% or 50% less than the square root of the ratio between the maximum hydrogen content and the minimum hydrogen content in the volume of the lens element.

In one embodiment, the lens element has, during irradiation with pulsed laser radiation at a wavelength of 193 nm, a change $dK/dF$ in the absorption coefficient K depending on the energy density F of less than $5 \times 10^{-4}$ cm×pulse/mJ, preferably of less than $1 \times 10^{-4}$ cm×pulse/mJ, particularly preferably of less than $5 \times 10^{-5}$ cm×pulse/mJ, in particular of less than $1 \times 10^{-5}$ cm×pulse/mJ. The silane content of fused silica can be determined only comparatively inaccurately using Raman spectroscopy: The detection limit is approximately 1 to $5 \times 10^{15}$ molecules/cm$^3$, which is typically an excessively high value for lithography applications. U.S. Pat. No. 7,928,026 B2 (or else WO 2006/136184) cited further above therefore describes an indirect method which uses the gradient $dK/dF$ of the transmission change K as a function of the energy density F as a measure.

U.S. Pat. No. 7,928,026 B2, particularly with regard to the measuring method by which the values described above can be determined, is incorporated by reference in the content of this application. It can be gathered from U.S. Pat. No. 7,928,026 B2 that the measured values or the experimental measurement set-up has a reproducibility of approximately $3 \times 10^{-5}$ cm×pulse/mJ. This is plausible since a measurement is permitted to be carried out in the range of energy densities between typically 0.5 mJ/cm$^2$ and a maximum of 10 mJ/cm$^2$ (where in the case of the latter energy density an irreversible ageing of the glass already commences within a few 10 000 pulses). Experience shows that transmission measurement in a ratiometric set-up (beam splitter and reference detector, main detector behind sample) is accurate at best to 0.3%. With a sample having a length of 10 cm, the above-indicated gradient of 0.3%/10 cm/10 mJ/cm$^2$=$3 \times 10^{-5}$ cm×pulse/mJ can thus be resolved.

Since loading temperatures below 300° C. are also intended to be made possible in the context of the present invention, the resolution described in U.S. Pat. No. 7,928,026 B2 is possibly no longer sufficient for determining the silane content. Alternatively, the change in absorption or the silane content can be measured on small samples (path length of a few mm to cm) calorimetrically (cf. the thesis "Kalorimetrische Bestimmung der UV-Strahlungsabsorption an optischen Gläsern und dünnen Schichten unter besonderer Berücksichtigung laserinduzierter Änderungen" ["Calorimetric Determination of UV Radiation Absorption on Optical Glasses and Thin Layers Taking Particular Account of Laser-induced Changes"], by Eric Eva, Laser-Laboratorium Göttingen, LLG, 1994, in particular page 34 and pages 36-37) or photothermally (cf. K. Mann, A. Bayer, T. Miege, U. Leinhos and B. Schafer "A Novel Photo-Thermal Setup for Evaluation of Absorptance Losses and Thermal Wavefront Deformations in DUV Optics", Proceedings of the 39th Boulder Damage Symposium, Boulder, Co (USA), SPIE Vol. 6720, 6720-72 (2007)) and C. Mühlig et al., "Characterization of low losses in optical thin films and materials", Applied Optics, Vol. 47, Issue 13, pp. C135-C142). What these methods have in common is that they measure a quantity which is directly proportional to the absorption that is variable as a function of the energy density, such as the heating of the sample, the distortion of a transmitted wavefront or the deflection of a test beam. Therefore, it is possible to measure gradients $dK/dF$ 3-4 orders of magnitude smaller than with ratiometry. In particular, the photothermal methods are also suitable for line scans on a sample, that is to say for determining the predicted profile of the absorption or of the silane content in a blank or in a lens element in the thickness direction.

In one embodiment, the lens element or the fused silica has an OH content of less than 200 ppm by weight, preferably of less than 100 ppm by weight, particularly preferably of less than 20 ppm by weight, very particularly preferably of less than 10 ppm by weight, in particular of less than 1 ppm by weight. The so-called "dry" fused silica having a low OH content is well suited to lithography and is typically produced in a soot process, sintered and subjected to stress-relief annealing before it is loaded with hydrogen.

Besides a low OH content, a fused silica used for microlithography should also have a low number of defects, that is to say that the content of ODC and peroxy centres should not be too great, which can be achieved for example by controlled oxidative healing of defect centres. The fictive temperature of the fused silica, too, should not be too high and should be e.g. less than 1000° C. The fictive temperature is a parameter that characterizes the specific network structure of the fused silica and that can be determined e.g. by IR spectroscopy or by Raman scattering, as is described for example in U.S. Pat. No. 7,928,026 B2.

In a further embodiment, the lens element has a refractive index in a vacuum of less than 1.560830, preferably of less than 1.560810, particularly preferably of less than 1.560800, in particular of less than 1.560790, for radiation at a vacuum wavelength of 193.368 nm (i.e. radiation of an ArF laser). An increase in the OH content of the fused silica by 10 ppm brings about a refractive index lower by approximately 1 ppm, that is to say that a fused silica having an OH content of approximately 200 ppm by weight typically has the lowest refractive index (1.560790) indicated here. The refractive index of the fused silica is influenced not only by the OH content but also by further material properties, for example by the content of molecular hydrogen present in the fused silica.

In a further embodiment, at all locations in the volume of the lens element the silane content is less than $5 \times 10^{14}$ molecules/cm$^3$, preferably less than $1 \times 10^{14}$ molecules/cm$^3$, in particular less than $5 \times 10^{13}$ molecules/cm$^3$. For the purposes of this application, the term silane molecules is understood to mean Si—H compounds. As was described further above, the silane content is typically determined indirectly via the FDT gradient since the measurement limit is generally too low for direct detection. The value for the silane content of the fused silica that is ascertained in a direct determination should generally not be greater than the upper limits specified here.

The properties described further above in association with a lens element typically also apply to a blank composed of fused silica from which such a lens element is produced (typically by mechanical processing), that is to say that a typically cylindrical blank composed of fused silica which was loaded with hydrogen in the manner described further above in association with the method also has the features regarding the hydrogen content and the silane content as described above in association with the lens element.

In irradiation experiments it was found that even dry soot glasses loaded at 400-500° C., if they were loaded to an absolute $H_2$ content that was high owing to a high expected energy density, exhibit intensified compaction with a rise—more than linearly dependent on the pulse number—in the wavefront distortion and premature formation of microchannels long before the hydrogen in the fused silica is consumed by the continuous irradiation. In comparison, the same fused silicas, loaded at the same temperature to an $H_2$ content 2-5× lower, do not exhibit this effect as long as the total dose is still low enough that free hydrogen remains available in the fused silica. This effect is attributed to the formation of thermal SiH as mentioned in the introduction, since a reduction of the loading temperature to significantly below 400° C. while maintaining the high absolute content had the effect that the glasses behaved just like or better than the glasses loaded at 400-500° C. to an $H_2$ content 2-5× lower.

With the aid of the method described above, it is possible to carry out temporally practicable loading in the second stage (and, if appropriate, in the first stage as well) at temperatures below 400° C., if appropriate below 300° C., in particular if comparatively small blanks having a thickness of, for example, less than approximately 8 cm, 5 cm or 3 cm are loaded. In this way, in regions of the blank which are subjected to a high energy density, it is possible to achieve a hydrogen content of more than $1 \times 10^{17}$ molecules/$cm^3$, $2 \times 10^{17}$ molecules/$cm^3$ or $5 \times 10^{17}$ molecules/$cm^3$ without the problems described above occurring.

In one embodiment, a wavefront distortion of the lens element on account of compaction during irradiation with pulsed laser radiation at a wavelength of 193 nm does not rise more than linearly with the pulse number of the pulsed laser radiation. As was described further above, the more than linear rise in wavefront distortion can be prevented by low loading temperatures in the (at least) two loading stages.

In a further embodiment, the lens element exhibits no formation of microchannels after a dose of 200 billion pulses having a pulse duration of in each case 150 ns at an energy density of 0.5 $mJ/cm^2$/pulse or after a dose of 3.5 billion pulses having a pulse duration of in each case 130 ns at an energy density of 6.5 $mJ/cm^2$/pulse.

Irradiation with 200 billion pulses and an energy density of 0.5 $mJ/cm^2$ is typically carried out during the operation of the lens element in a projection exposure apparatus over the entire lifetime of the lens element, that is to say that the lens element remains free of microchannels over its entire lifetime. Irradiation with 3.5 billion pulses at a higher energy density of 6.5 $mJ/cm^2$ represents a test criterium which makes it possible, using a significantly smaller number of pulses, to check whether the lens element will remain free of microchannels over its entire lifetime.

A further aspect of the invention relates to an optical arrangement, in particular a projection exposure apparatus for microlithography, which comprises at least one lens element as described above. The properties of the fused silica used for a respective lens element of the projection lens can be defined suitably depending on the position of the lens element in the projection lens. By way of example, the position of the lens element in the e.g. convergent or divergent beam path has an influence on the energy density of the radiation passing through the lens element and thus on the required hydrogen content.

Particularly if the lens element is a last lens element of the projection lens, a high energy density typically occurs at the planar exit surface (formed, if appropriate, at a conic section of the lens element) of the lens element arranged in the convergent beam path, such that there a high hydrogen content should be introduced into the fused silica material. In the case, too, of lens elements which are arranged at other locations in the projection lens or, if appropriate, in an illumination system disposed upstream thereof in the beam path, the choice of a fused silica material having properties optimized for the respective position can significantly increase the optical properties of the entire projection exposure apparatus. The lens elements described here can also be used advantageously in optical apparatuses other than lithography apparatuses.

Further features and advantages of the invention are evident from the following description of exemplary embodiments of the invention, with reference to the figures of the drawing, and from the claims. The individual features can each be realized individually by themselves or as a plurality in any combination in a variant of the invention.

BRIEF DESCRIPTION OF THE DRAWINGS

Exemplary embodiments are illustrated in the schematic drawing and are explained in the following description. In the figures.

DETAILED DESCRIPTION

In the following description of the drawings, identical reference signs are used for identical or functionally identical components.

Figure 1:
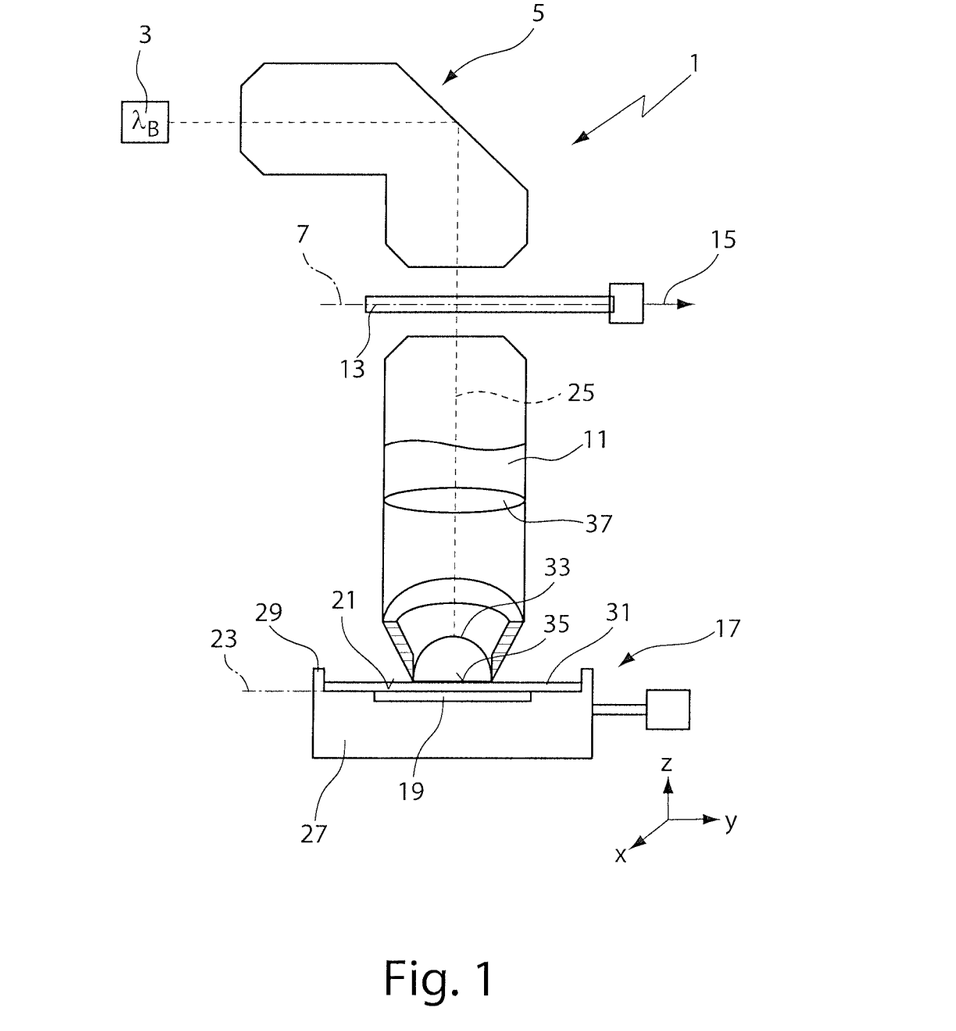
FIG. 1 shows a schematic illustration of one exemplary embodiment of a projection exposure apparatus for immersion lithography.

FIG. 1 schematically shows a microlithographic projection exposure apparatus 1 provided for producing large scale integrated semiconductor components using immersion lithography. The projection exposure apparatus 1 comprises as light source an excimer laser 3 having an operating wavelength of approximately 193 nm. Alternatively, light sources having other operating wavelengths, for example 248 nm or 157 nm, could also be used. An illumination system 5 disposed downstream generates in its exit plane or object plane 7 a large, sharply delimited, very homogeneously illuminated illumination field adapted to the telecentricity requirements of the projection lens 11 disposed downstream. The illumination system 5 has devices for controlling the pupil illumination and for setting a predefined polarization state of the illumination light. In the beam path downstream of the illumination system 5, a device (reticle stage) for holding and moving a mask 13 is arranged such that the latter lies in the object plane 7 of the projection lens 11 and is moveable in said plane for scanning operation in a driving direction 15.

The projection lens 11 follows downstream of the object plane 7, also designated as mask plane, said projection lens imaging an image of the mask with a reduced scale onto a substrate 19, for example a silicon wafer, said substrate being covered with a photoresist, also called resist 21. The substrate 19 is arranged such that the planar substrate surface with the resist 21 substantially coincides with the image plane 23 of the projection lens 11. The substrate is held by a device 17 comprising a drive for moving the substrate 19 synchronously with the mask 13. The device 17 also comprises manipulators for moving the substrate 19 both in the z-direction parallel to the optical axis 25 of the projection lens 11 and in the x- and y-directions perpendicular to said axis.

The device 17 (wafer stage) provided for holding the substrate 19 is designed for use in immersion lithography. It comprises a receptacle device 27, which is moveable by a scanner drive and the base of which has a flat cutout for receiving the substrate 19. By virtue of a circumferential edge 29, a flat, upwardly open, liquid-tight receptacle for an immersion liquid 31 is formed. The height of the edge is dimensioned such that the introduced immersion liquid 31 can completely cover the substrate surface 21 with the resist and the exit-side end region of the projection lens 11 can dip into the immersion liquid 31 with a correctly set working distance between lens exit and substrate surface 21. The immersion liquid 31 can also be introduced between the lens exit and the resist 21 in a different manner from that illustrated in FIG. 1.

The projection lens 11 has an image-side numerical aperture NA of at least NA=1.2, typically of more than NA=1.3, and is thus particularly adapted to use with immersion liquids. The projection lens 11 has an approximately hemispherical planoconvex lens 33 as the last imaging optical element closest to the image plane 23, the exit surface 35 of said planoconvex lens element forming the last optical surface of the projection lens 11. The exit side of the last lens element 33 is completely immersed in the immersion liquid 31 during the operation of the projection exposure apparatus 1 and is wetted by said liquid. The hemispherical planoconvex lens element 33 consists of fused silica in the same way as a further lens element 37 of the projection lens 11 which is illustrated by way of example in FIG. 1.

The fused silica of the last lens element 33 is a dry fused silica having an OH content of typically less than 10 ppm (by weight), in particular of less than 5 ppm or of less than 1 ppm (by weight), which was produced in a soot process. The fused silica of the last lens element 33 has been annealed to a low defect density i.e. its fictive temperature $T_f$ is below 1000° C., its refractive index n at a vacuum wavelength $\lambda_B$ of 193.368 nm, which corresponds to the wavelength of the laser 3 used for generating the laser radiation 4, is between approximately 1.560795 and 1.560830 at room temperature (22° C.). While the calibration of the fictive temperature $T_f$ is not uniform, the refractive index n, to put it more precisely the real part thereof, can be detected very accurately. For the same OH content of the fused silica, a lower refractive index n of the fused silica means a lower fictive temperature $T_f$.

Figure 2:
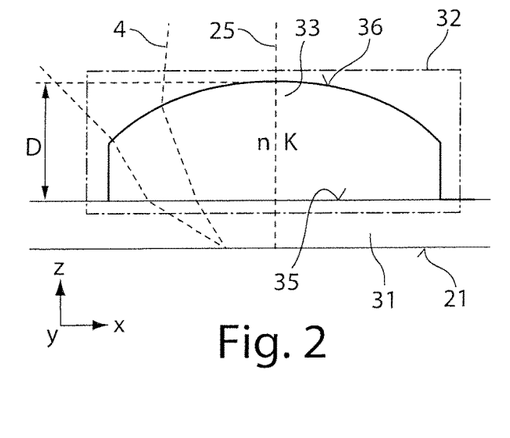
FIG. 2 shows a schematic illustration of a last lens element of a projection lens of the projection exposure apparatus from FIG. 1.

During the operation of the projection exposure apparatus 1, the fused silica material of the lens elements 33, 37 is irradiated by the excimer laser 3 (ArF laser) with intensive laser pulses at the operating wavelength of 193 nm. Depending on the choice of the illumination settings (e.g. in the case of dipole or quadrupole illumination), in particular the last lens element 33, illustrated in FIG. 2, in partial regions of its volume, in particular in direct proximity to the exit surface 35, is subjected to laser radiation 4 having high pulse energy densities of, for example, approximately 0.5 mJ/cm$^2$ or higher, the pulse duration typically being approximately 150 ns or higher. The pulse duration is understood to mean—as generally customary—the equivalent pulse duration or the so-called "total integral square" (TIS), i.e. the ratio of the square of the time integral over the intensity of a pulse to the time integral over the squared intensity of said pulse.

Figure 3:
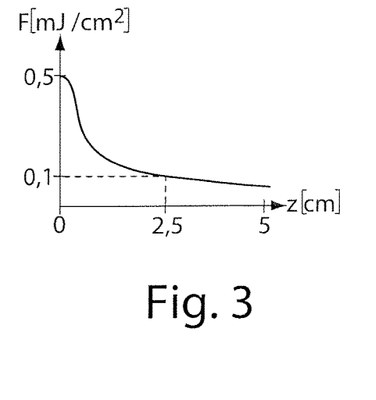
FIG. 3 shows a schematic illustration of the distribution of the energy density in the thickness direction that occurs in the last lens element.

As can be discerned in FIG. 3, in the volume of the last lens element 33 in the thickness direction z of the lens element 33 the energy density F decreases continuously starting from the light exit surface 35 to the opposite light entrance surface 36. At the location of half the thickness D/2=2.5 cm of the last lens element 33, the energy density F is only approximately 0.1 mJ/cm$^2$/pulse, i.e. it is lower than at the exit surface 35 by a factor of five. The curve shown in FIG. 3 shows, for each position in the thickness direction z, the maximum energy density in a plane (i.e. in the x,y-direction) of the lens element 33 that is assigned to said position. In the example shown, the last lens element 33 has a thickness D of 5 cm and the thickness of a blank 32 from which the last lens element 33 was produced is slightly larger since said blank has a (small) oversize.

The last lens element 33 is designed for a load of approximately 200 billion pulses having the energy density F respectively shown in FIG. 3 before replacement becomes necessary. In order to achieve this lifetime, in the case of the above-described energy density F at the exit surface 35 or directly adjacent to the exit surface 35, i.e. as far as a distance $d_1$ 1 mm from the exit surface, a hydrogen content of approximately $1 \times 10^{17}$ molecules/cm$^3$ is required, as is evident with reference to the distribution curve in FIG. 4. This value for the maximum hydrogen content is an exemplary value; typical values for the hydrogen content (or the deuterium content) are between approximately $5 \times 10^{16}$ molecules/cm$^3$ and $1 \times 10^{18}$ molecules/cm$^3$.

Typically, the required hydrogen content in a respective volume region of a lens element composed of fused silica depends approximately quadratically on the energy density occurring there. In the case of an energy density F lower by a factor of five in the centre of the last lens element 33, accordingly only a hydrogen content of approximately $4 \times 10^{15}$ molecules/cm$^3$ is required there. For reasons of process reliability (reliable detection with Raman spectroscopy or in the case of omission of measurements after loading buffer for concentration fluctuations caused by temperature fluctuations in the loading furnace and fluctuations of the defect density in the glass), a minimum hydrogen content of $1 \times 10^{16}$ molecules/cm$^3$ is defined for the centre of the last lens element 33 (at a (third) distance $d_3$=2.5 cm from the (planar) exit surface 35) or of the associated blank 32. It has proved to be advantageous if the hydrogen content [H$_2$] falls comparatively rapidly from the exit surface 35 and, for example at a second distance $d_2$=8 mm from the exit surface 35, falls to at least 50% of the maximum value of the hydrogen content [H$_2$] that is present at the exit surface 35. Overall, this therefore results in the distribution—advantageous for the present use and illustrated in FIG. 4—of the hydrogen content [H$_2$] in the thickness direction (z-direction) of the last lens element 33.

Figure 4:
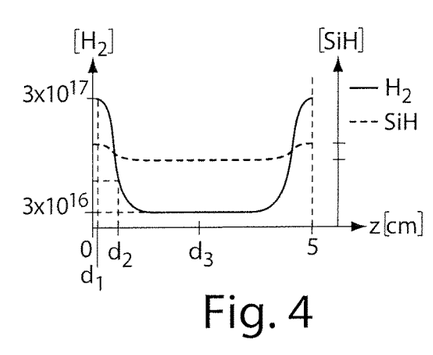
FIG. 4 shows a schematic illustration of the distribution of the hydrogen content and of the silane content of the last lens element in the thickness direction.
Figure 6:
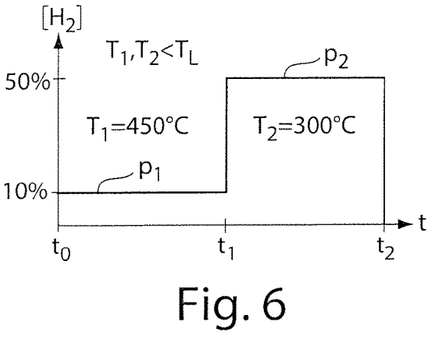
FIG. 6 shows one example of the sequence of a two-stage hydrogen loading process for the lens elements in accordance with FIG. 4 and FIG. 5.

In order to produce the distribution of the hydrogen content [H$_2$] in the last lens element 33 as shown in FIG. 4, a hydrogen loading of the blank 32 from which the last lens element 33 is produced is performed, which is described in greater detail below with reference to FIG. 6. For loading, the blank 32 is introduced into a furnace (not shown), in which a hydrogen-containing atmosphere prevails and which is heated to a constant temperature during conventional loading in order that the hydrogen from the surroundings can diffuse into the blank 33. The duration of the loading with hydrogen depends on the desired hydrogen content and on the chosen temperature during the loading with hydrogen. Typically, the loading takes a number of weeks or months, wherein the loading can possibly take a year or longer at low temperatures of e.g. approximately 300° C.

In order to shorten the loading duration and nevertheless ensure that not too much silane (SiH) forms in the fused silica material, it is proposed to modify the known loading process as follows: The loading of the blank 32 is carried out in two loading stages (cf. FIG. 6), wherein in the first loading stage the blank 32 is loaded at a first temperature $T_1$ and a first hydrogen partial pressure $p_1$, and in the second loading stage the blank 32 is loaded at a second temperature $T_2$, which is different from the first temperature, and a second hydrogen partial pressure $p_2$ which is different from the first hydrogen partial pressure.

Typically, in this case the first loading stage is carried out at a first hydrogen partial pressure $p_1$ that is lower than the second hydrogen partial pressure $p_2$ in the second loading stage. Moreover, the temperature $T_1$ in the first loading stage is generally chosen to be greater than the temperature $T_2$ in the second loading stage. In this way, for example, the hydrogen distribution in the blank 32 as shown in FIG. 4 can be produced, as is explained in detail below:

In the first stage, a value of 450° C. is chosen for the loading temperature $T_1$. At 100% hydrogen partial pressure at a total pressure of 1 atm in the loading furnace, a concentration or a hydrogen content of approximately $3 \times 10^{17}$ molecules/cm$^3$ is established in the equilibrium state in the fused silica. Accordingly, with infinitely long loading at this temperature $T_1$, a hydrogen concentration of approximately 3% at standard pressure would suffice to achieve the required value of approximately $1 \times 10^{16}$ molecules/cm$^3$ in the centre of the blank 32. For loading times of the order of magnitude of a few weeks or a few months, a partial pressure $p_1$ of approximately 10%, for example, will be chosen in the first stage. As a result, a hydrogen content of approximately $3 \times 10^{16}$ molecules/cm$^3$ is established in the outer regions of the blank 32, i.e. in particular adjacent to the later exit surface 35 of the last lens element 33, which still does not lead to relevant SiH formation at the chosen temperature $T_1$ of approximately 450° C. in the first loading stage. The first loading duration $t_1 - t_0$ up to the point in time $t_1$ can be chosen to be short enough that only approximately 80-90% of the desired content of $1 \times 10^{16}$ molecules/cm$^3$ is established in the centre of the blank 32 since the hydrogen introduced in the first loading stage diffuses further inwards during the second loading stage (from $t_1$ to $t_2$) and, as a result, the desired value is attained in the centre of the blank 32. The first loading stage lasts approximately as long as is necessary for an averagely or slightly burdened lens element position having the same thickness at the same loading temperature $T_1$ i.e. the loading duration $(t_1 - t_0)$ of the first stage is approximately 10 weeks.

In the second stage, the hydrogen required in the outer regions of the blank 32 is introduced at a significantly lower temperature $T_2$, for example at less than approximately 300° C., e.g. at approximately 250° C. A hydrogen partial pressure $p_2$ of 50% relative to standard pressure is chosen in the second stage. This has the effect that the minimum content of $1 \times 10^{17}$ molecules/cm$^3$ is reliably attained in the outermost regions of the blank 32. Since the solubility of hydrogen is higher at low temperatures, a higher content of approximately $2 \times 10^{17}$ molecules/cm$^3$ can possibly also be established there. As was explained further above, at a distance $d_2$ of 8 mm from the exit surface 35 the hydrogen content is permitted to have already fallen to half (50%), such that at the specified temperature a loading duration $(t_2 - t_1)$ in the second loading stage of a few weeks is sufficient.

A pressure in the loading furnace or autoclave of higher than standard pressure (1 atm) is permitted to be chosen in particular for the second loading stage. Likewise, the temperature is permitted to fall to room temperature (22° C.) again between the first and second stages, since no relevant diffusion of hydrogen into the blank 32 takes place any longer at room temperature. This enables blanks to be collected and stored, which blanks can then be subjected to the second loading stage in the furnace in a common batch.

The temperatures $T_1$, $T_2$ and partial pressures $p_1$, $p_2$ specified here should be understood to be merely by way of example. The partial pressures $p_1$, $p_2$ are typically coordinated with one another such that the desired hydrogen content is established in the centre of the blank 32 in an economically tenable total process duration ($t_0$ to $t_2$). Depending on the application, the first partial pressure $p_1$ can be for example approximately 20% or less, and the second partial pressure $p_2$ approximately 50% or higher, if appropriate 90% or higher, in particular even 100% or higher (if a pressure above standard pressure, i.e. of more than 1 atm, prevails in the furnace). In particular, the first temperature $T_1$ can be between approximately 400° C. and 500° C., but temperatures that are significantly higher are also possible, as is described in greater detail further below. The second temperature $T_2$ is typically 400° C. or lower, but can in particular also be 300° C. or less.

In order to define the loading temperature $T_1$ in the first stage, the following procedure can be adopted: Firstly, a hydrogen content appropriate for the later application is chosen for a basic glass (prior to loading), said hydrogen content being determined by the maximum expected energy density and pulse number on the respective lens element in the optical system. Afterwards, samples or blanks loaded at different temperatures are produced and subjected to an FDT test, for example as explained in U.S. Pat. No. 7,928,026 B2, and a limit temperature $T_L$ is found starting from which the FDT value, i.e. the gradient dK/dF of the absorption coefficient K (cf. FIG. 2), rises significantly (for the glasses from FIG. 2 of U.S. Pat. No. 7,928,026 B2 for example $T_L$ of approximately 475° C.). In particular, the limit temperature $T_L$ can also be determined by a comparison of the gradient dK/dF with a threshold value, which can be for example $5 \times 10^{-4}$ cm×pulse/mJ or lower. A lower temperature $T_1$ with a sufficient separation from the point starting from which the gradient increases significantly (i.e. from the limit temperature $T_L$) is defined for the actual loading in series production. The loading temperature $T_2$ in the second stage is also chosen to be lower than the limit temperature $T_L$.

Since the FDT gradient is only one necessary indicator of good lifetime behaviour, for complete qualification the fused silica material can additionally be subjected to a long-term test in which it is irradiated for billions of pulses with energy densities of up to approximately one order of magnitude above the later use conditions and is then examined for compaction, induced absorption, hydrogen consumption, etc. It is also possible to choose different loading temperatures for lens element positions which are subjected to loads of different magnitudes and which require a different hydrogen content and different laser durability, with the same basic glass.

For a given (first) loading temperature $T_1$, it should now also be clarified how the SiH concentration is dependent on the hydrogen concentration. Generally, the type of precursor defects of the basic glass will also influence this relationship, but starting points for this relationship can be derived with reference to Table 1 of U.S. Pat. No. 7,928,026 B2: For pairs of blanks having the same loading temperature and approximately the same OH content and the same fictive temperature, the FDT gradient (dK/dF) behaves predominantly like the square root of the hydrogen contents. With this relation being taken as a basis, in the case of conventional loading at a constant temperature in the case of the hydrogen distribution shown in FIG. 4 in the outer regions of the blank 32 a high silane content would be established here, specifically typically a ratio of 3.1:1 in the silane content in the case of the ratio—illustrated in FIG. 4—of 10:1 in the case of the hydrogen content [$H_2$] from the exit surface 35 to the centre of the blank 32.

In the case of the two-stage method proposed further above, there results only a small increase in the silane content in the outer regions of the blank, which is of the order of magnitude of a few 10% in the region of the exit surface 35, as can likewise be discerned in FIG. 4, which shows the silane content [SiH] (in arbitrary units), said silane content typically being of an order of magnitude of between approximately $1 \times 10^{13}$ molecules/cm$^3$ and $5 \times 10^{15}$ molecules/cm$^3$, wherein ideally at all locations in the volume of the lens element or of the blank 32 the silane content is less than $5 \times 10^{14}$ molecules/cm$^3$, less than $1 \times 10^{14}$ molecules/cm$^3$, or less than $5 \times 10^{13}$ molecules/cm$^3$. The silane content thus varies over the volume of the blank 32 (in this thickness direction z) by less than 30%, that is to say that the (minimum) value in the centre of the blank 32 is less than 30% below the maximum value of the silane content which occurs at the edge of the blank 32 in the region of the later exit surface 35.

Since Raman spectroscopy, conventionally used for determining the silane content, generally has an excessively high detection limit for lithography applications, the FDT gradient can be used as a measure of the silane content, said gradient being defined as the change dK/dF in the absorption coefficient K of the fused silica depending on the energy density F during irradiation with pulsed laser radiation at the operating wavelength $\lambda_B$=approximately 193 nm used here. In the case illustrated above, there results an FDT gradient (dK/dF) of less than $5 \times 10^{-4}$ cm×pulse/mJ, of less than $1 \times 10^{-4}$ cm×pulse/mJ, of less than $5 \times 10^{-5}$ cm×pulse/mJ, ideally of less than $1 \times 10^{-5}$ cm×pulse/mJ, in conjunction with a short and hence economic loading duration.

Overall, the loading method described here makes it possible to obtain a profile of the hydrogen content which is tailored to the requirement profile of the last lens element 33 and which would not have been possible in the case of conventional loading at a uniform loading temperature: The high hydrogen content is very closely restricted to the outer millimeters of the lens element 33 or of the blank 32 and does not have the very excessive increase that results in the case of loading at more than standard pressure. The refractive index profile in the lens element 33, said profile being dependent on the hydrogen content, is flatter and more reproducible and said lens element is therefore handleable more easily. As a result of the loading of the outer regions at a lower temperature $T_2$, the silane content is increased only insignificantly, as a result of which a better performance over the lifetime and a higher loading according to the full lifetime striven for are possible. In the inner portion of the last lens element 33, the actual curve—shown in FIG. 4—of the hydrogen content [$H_2$] lies only just above the requirement curve (not illustrated), as a result of which less absorption and less change in absorption as a function of the energy density arise upon integration along the beam path through the lens element 33.

Figure 5:
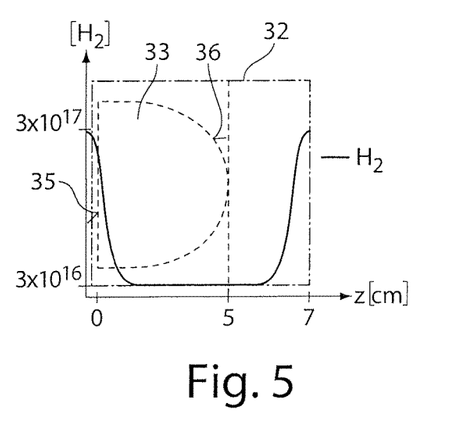
FIG. 5 shows an illustration analogous to FIG. 4 for a further exemplary embodiment of a last lens element.

If the mirrored profile of the hydrogen content [$H_2$] on the other side of the blank 32 or at the light entrance surface 36 of the last lens element 33 proves to be disturbing, the blank 32, as illustrated in FIG. 5, can be produced for example with an oversize of e.g. 1 to 2 cm thickness and this oversize can be separated after loading, as is indicated in FIG. 5. As is evident with reference to FIG. 5, the hydrogen content [$H_2$] rises only insignificantly in the thickness direction (z-direction) from the minimum value, which is assumed in the centre of the blank 32, as a result of the separation of the oversize up to the light entrance surface 36, where it reaches not more than 30% of the content of hydrogen at the light exit surface 35, that is to say that it is possible in this way to produce a non-mirror-symmetrical hydrogen distribution in the last lens element 33.

Figure 7:
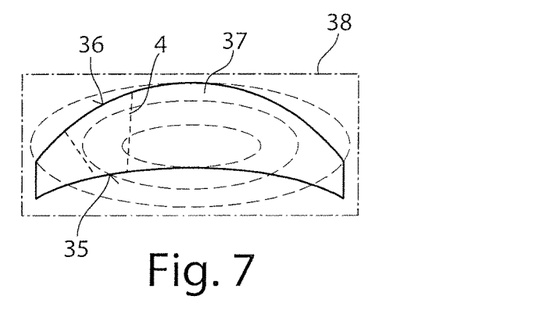
FIG. 7 shows an illustration of a further lens element for the projection lens from FIG. 1.

The above-described method for loading a blank with hydrogen can be used not just in the case of lens elements which are impinged on by radiation having a high energy density and accordingly have to be loaded with a high hydrogen content; rather, the method described above can advantageously be used for loading arbitrary lens elements, particularly in the case of lens elements having a low load and/or a small difference in the energy density on the front and rear sides, as explained below by way of example on the basis of the concavo-convex meniscus lens element 37 illustrated in FIG. 7. As is indicated in FIG. 7, the meniscus lens element 37 is arranged in the convergent beam path of the laser radiation 4, that is to say that the convexly curved lens element surface 36 constitutes the light entrance surface and the concavely curved lens element surface 35 constitutes the light exit surface, wherein, as described above, the differences in the energy densities at the two surfaces 35, 36 are comparatively small.

In the present exemplary embodiment, it is proposed to determine the density of reactive defects and contaminants of the basic glass (i.e. of the glass prior to loading) theoretically or experimentally and to define a mean content in a blank 38, which is composed of the maximum defect density, the requirement calculated from the energy density in the centre, and a safety factor, and is typically of the order of magnitude of 0.2 to $2 \times 10^{15}$ molecules/cm$^3$, i.e. is lower than the hydrogen content usually set in the centre of the blank 38, said hydrogen content being approximately 5 to $10 \times 10^{15}$ molecules/cm$^3$.

In the first stage of loading the blank 38, a partial pressure $p_1$ of typically between 0.25% and 2.5% is chosen, which, given a suitably chosen first loading duration $t_1-t_0$ of a number of weeks or months, leads to a hydrogen content at the edge of the blank 38 which is 1.5× to 5× above the hydrogen content in the centre of the blank 38, i.e. typically as far as a distance of 1 mm from the respective surface 35, 36 of the meniscus lens element 37 leads to a hydrogen content of between approximately $0.3 \times 10^{15}$ molecules/cm$^3$ and $1 \times 10^{16}$ molecules/cm$^3$.

In this example, the first stage of loading is carried out at a markedly high temperature $T_1$ of generally between approximately 500° C. and 1000° C., preferably between 700° C. and 1000° C., wherein care should be taken to ensure that a fused silica material is used which has a limit temperature $T_L$ that is above the first temperature $T_1$. At such high temperatures, temperatures that deviate by e.g. 25° C. during the loading are scarcely of any significance. Since the hydrogen that diffuses into the fused silica material still reacts locally with defects present there, high concentrations of free hydrogen do not occur, and so an excessively high silane content is not established in the fused silica blank 38 either.

In the second stage of loading, the increased hydrogen content required in the edge regions or at the surfaces 35, 36 is introduced at a lower temperature $T_2$, for example between 400° C. and 500° C., and a higher partial pressure $p_2$ of between approximately 1% and 20%, the duration $t_2-t_1$ of the second loading stage being approximately six weeks, for example. Besides the low total content of silane, which, detected using the FDT gradient dK/dF, in this example, too, is less than $5 \times 10^{-4}$ cm×pulse/mJ, on account of the two-stage loading the silane content at the surfaces 35, 36 or at the outer sides of the blank 38 is between 1.1 times and 2.20 times the silane content in the centre of the blank 38. The ratio of maximum to minimum silane content is thus lower than the square root of the ratio between the maximum hydrogen content and the minimum hydrogen content in the volume of the blank 38.

In the variant of the method described here, the target content in the centre of the blank 38 after the first stage is calculated only from the defect density and a safety allowance. The second loading stage corresponds to the previously known single-stage loading process at $T_2$=400-500° C., but it is possible to dispense with the overloading in the centre of the blank 38 owing to an unknown defect density, which significantly shortens the loading process overall. This is particularly advantageous if the thickness of the blank 36, 38 is comparatively large and is e.g. more than approximately 5 cm, since loading durations of more than a year can result in this case in a conventional loading method at a constant temperature of e.g. 300° C.

During a loading stage at a constant temperature $T_1$ or $T_2$, if appropriate, the hydrogen partial pressure $p_1$, $p_2$ can be varied over time, as is explained in U.S. Pat. No. 6,810,687 B2 or 7,994,083 B2 cited in the introduction. Particularly in the second stage, a total pressure of more than 1 atm can also be set in the furnace. As can likewise be discerned with reference to FIG. 7, a three-dimensional distribution of the hydrogen content is established in the blank 38, in the case of which distribution areas of identical hydrogen concentration form ellipsoids of revolution, a minimum hydrogen content being established in the centre of the cylindrical blank 38. In the case shown, the concave lens element surface 35 is comparatively far away from the end side of the blank 38, such that there the hydrogen content is possibly significantly lower than at the end side of the blank 38. In the case of such a meniscus lens element 37, it may therefore be advantageous to carry out mechanical preprocessing prior to loading with hydrogen in order to adapt the geometry of the blank 38 to the later lens element geometry, as is described for example in DE 10 2007 022 881 A1, which is incorporated by reference in the content of this application.

With the aid of the method described above, it is possible to implement temporally practicable loading in the second stage and, if appropriate, also in the first stage at temperatures below 400° C. or below 300° C. particularly in the case of comparatively small blanks. In this way, it can be ensured that a wavefront distortion of the lens elements 33, 37 on account of compaction during irradiation with pulsed laser radiation at a wavelength of 193 nm does not rise more than linearly with the pulse number of the pulsed laser radiation, and that no microchannels form at the lens elements 33, 37 even after irradiation with approximately 200 billion pulses at energy densities of 0.5 mJ/pulse, i.e. over their entire lifetime.

What is claimed is:

1. A method for loading a blank composed of fused silica with hydrogen, comprising:
    loading the blank at a first temperature ($T_1$) of less than 475° C. and a first hydrogen partial pressure ($p_1$), and
    further loading the blank at a second temperature ($T_2$) of less than 300° C. and at a second hydrogen partial pressure ($p_2$) which is different from the first hydrogen partial pressure,
    wherein the first temperature and the second temperatures ($T_1$, $T_2$) are lower than a limit temperature ($T_L$) at which a thermal formation of silane in the fused silica of the blank commences, and
    wherein the loading and the further loading results in a silane content in all locations of the blank of less than $5 \times 10^{14}$ molecules/cm³.

2. The method according to claim 1, wherein the further loading of the blank is at a higher hydrogen partial pressure ($p_2 > p_1$) than is the loading.

3. The method according to claim 1, wherein the limit temperature ($T_L$) at which the thermal formation of the silane in the fused silica of the blank commences is determined prior to the loading.

4. The method according to claim 3, wherein the limit temperature ($T_L$) is determined based on a change (dK/dF) in absorption coefficient (K) of the fused silica of the blank with respect to an energy density (F) during irradiation of the blank with pulsed laser radiation at a wavelength of 193 nm.

5. The method according to claim 1, wherein the blank is further loaded at a temperature ($T_2$) of less than 400° C.

6. The method according to claim 1, wherein the blank is loaded at a hydrogen partial pressure ($p_1$) of less than 20%.

7. The method according to claim 1, wherein the blank is further loaded at a hydrogen partial pressure ($p_2$) of 50% or more.

8. A lens element composed of fused silica and providing a surface and a further surface configured to transmit radiation therethrough,
    wherein, at a distance ($d_1$) of 1 mm from the surface, the lens element has a hydrogen content ($[H_2]$) of at least $5 \times 10^{16}$ molecules/cm³,
    wherein, in an inner volume of the lens element, the hydrogen content ($[H_2]$) falls to a minimum value of 10% or less of the hydrogen content ($[H_2]$) at the surface, and
    wherein, at a distance ($d_2$) of 8 mm from the surface, the hydrogen content ($[H_2]$) falls to 50% or less of the hydrogen content ($[H_2]$) at the surface; and
    wherein at all locations in the volume of the lens element a silane content is less than $5 \times 10^{14}$ molecules/cm³.

9. The lens element according to claim 8, wherein a silane content varies over a thickness (D) of the lens element by not more than 50%.

10. The lens element according to claim 8, wherein, at a distance ($d_2$) of 8 mm from the surface, the hydrogen content ($[H_2]$) falls to 40% or less of the hydrogen content ($[H_2]$) at the surface.

11. The lens element according to claim 8, wherein the hydrogen content ($[H_2]$) as far as a distance ($d_3$) of 25 mm from the surface falls to 10% or less of the hydrogen content ($[H_2]$) at the surface.

12. The lens element according to claim 8, wherein the hydrogen content ($[H_2]$) rises in a thickness direction (z) of the lens element from the minimum value to the further surface for passage of radiation to not more than 30% of the hydrogen content ($[H_2]$) at the surface.

13. The lens element according to claim 8, which has, during irradiation with pulsed laser radiation at a wavelength of 193 nm, a change dK/dF in absorption coefficient (K) with respect to an energy density (F) of less than $5 \times 10^{-4}$ cm×pulse/mJ.

14. The lens element according to claim 8, which has an OH content of less than 200 ppm by weight.

15. The lens element according to claim 8, which has a refractive index (n) of less than 1.560830 for radiation at a wavelength ($\lambda_B$) of 193.368 nm.

16. The lens element according to claim 8, wherein a wavefront distortion resulting from compaction during an irradiation of the lens element with pulsed laser radiation at a wavelength of 193 nm rises no more than linearly with pulse number of the laser radiation.

17. The lens element according to claim 8, which exhibits no formation of microchannels after receiving a dose of 200 billion pulses having a pulse duration of in each case 150 ns at an energy density of 0.5 mJ/cm$^2$/pulse or at a dose of 3.5 billion pulses having a pulse duration of in each case 130 ns at an energy density of 6.5 mJ/cm$^2$/pulse.

18. A projection lens, comprising at least one lens element according to claim 8.

19. The projection lens according to claim 18, wherein the lens element is a last lens element of the projection lens.

20. A lens element composed of fused silica and providing a surface and a further surface configured to transmit radiation therethrough, wherein at least at one location in an inner volume of the lens element a hydrogen content ($[H_2]$) is less than $2 \times 10^{15}$ molecules/cm$^3$, wherein the hydrogen content ($[H_2]$) at the surface and at the further surface is between 1.5 times and 5 times the hydrogen content ($[H_2]$) at the at least one location, wherein a silane content at the surface and at the further surface of the lens element is between 1.1 times and 2.20 times the silane content at the at least one location; and wherein at all locations in the volume of the lens element a silane content is less than $5 \times 10^{14}$ molecules/cm$^3$.

21. A lens element composed of fused silica, wherein a ratio between a maximum silane content and a minimum silane content in a volume of the lens element is lower than a square root of the ratio between a maximum hydrogen content ($[H_2]$) and a minimum hydrogen content ($[H_2]$) in the volume of the lens element and wherein at all locations in the volume of the lens element a silane content is less than $5 \times 10^{14}$ molecules/cm$^3$.

* * * * *

UNITED STATES PATENT AND TRADEMARK OFFICE
CERTIFICATE OF CORRECTION

PATENT NO. : 10,427,965 B2
APPLICATION NO. : 15/013499
DATED : October 1, 2019
INVENTOR(S) : Eric Eva Page 1 of 1

It is certified that error appears in the above-identified patent and that said Letters Patent is hereby corrected as shown below:

In the Claims

Column 24, Line 41, In Claim 8, delete "surface, and" and insert -- surface, --, therefor.

Column 26, Line 19, In Claim 21, delete "element" and insert -- element; --, therefor.

Signed and Sealed this
Twenty-fourth Day of March, 2020

Andrei Iancu
*Director of the United States Patent and Trademark Office*